United States Patent [19]

Shikano et al.

[11] 4,028,723
[45] June 7, 1977

[54] COOLING DEVICE FOR HEAT GENERATION MEMBER

[75] Inventors: Yoshiro Shikano; Yasuhiro Ueoka, both of Amagasaki, Japan

[73] Assignee: Mitsubishi Denki Kabushiki Kaisha, Tokyo, Japan

[22] Filed: Feb. 24, 1975

[21] Appl. No.: 552,145

[52] U.S. Cl. .................................. 357/82; 357/74; 357/81
[51] Int. Cl.² ................. H01L 23/02; H01L 25/04; H01L 23/12
[58] Field of Search .................. 357/74, 81, 82

[56] References Cited
UNITED STATES PATENTS

| | | | |
|---|---|---|---|
| 3,573,574 | 4/1971 | Davis | 357/82 |
| 3,711,789 | 1/1973 | Dierschke | 357/82 |
| 3,743,893 | 7/1973 | Yamomoto | 357/82 |
| 3,893,162 | 7/1975 | Weidemann | 357/82 |

*Primary Examiner*—Edward J. Wojciechowicz
*Attorney, Agent, or Firm*—Wenderoth, Lind and Ponack

[57] ABSTRACT

Within a refrigerant two planar semiconductor elements are sandwiched between two cooling member while another cooling member is interposed between the elements. The interposed cooling member includes three through holes vertically running through it and each of the outermost cooling members includes three grooves vertically extending throughout that surface remote from the semiconductor elements. An axial hole may be provided on each of the cooling members.

4 Claims, 14 Drawing Figures

COOLING DEVICE FOR HEAT GENERATION MEMBER

BACKGROUND OF THE INVENTION

This invention relates to a vapor cooling device for cooling a heat generation member, and more particularly to improvements in a cooling member abutting against a heat generation member.

Heretofore it has been difficult to provide small-sized cooling members for use with vapor cooling systems. For example, in order to make a vapor cooled semiconductor device small-sized, the cooling member therefore must be decreased in dimension. This decrease in size is accompanied by an increase in thermal flux flowing through the heat transfer surface of the small-sized cooling member to a refrigerant contacting that surface. At a moderate thermal flux or less, the refrigerant boils in a region of nuclear ebullition in which bubbles in the form of string-like beads are successively generated from the heat transfer surface of the cooling member; but at extremely high thermal fluxes, the boiling state of the refrigerant is such that a film of vapor from the refrigerant covers the entire heat transfer surface and bubbles of the refrigerant are intermittently generated and raised from the film of vapor. In the latter case the refrigerant is called as boiling in a region of film ebullition. This may result in the thermal destruction of the device due to an abrupt rise in temperature. To avoid this difficulty requires much labor and skillful manufacturing technique.

Accordingly it is an object of the present invention to provide a new and improved cooling member simple in configuration and simply manufactured to permit the resulting device to be low in thermal resistance and also to be small-sized.

SUMMARY OF THE INVENTION

The present invention provides a cooling device comprising a heat generation member, and a cooling member abutting against the heat generation member, the heat generation member and the cooling member being immersed into an amount of refrigerant boilable at a temperature less than the rated temperature of the heat generation member. The cooling member includes at least one hole extending therethrough or at least one groove extending on one surface thereof, the refrigerant flowing through the hole or groove.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
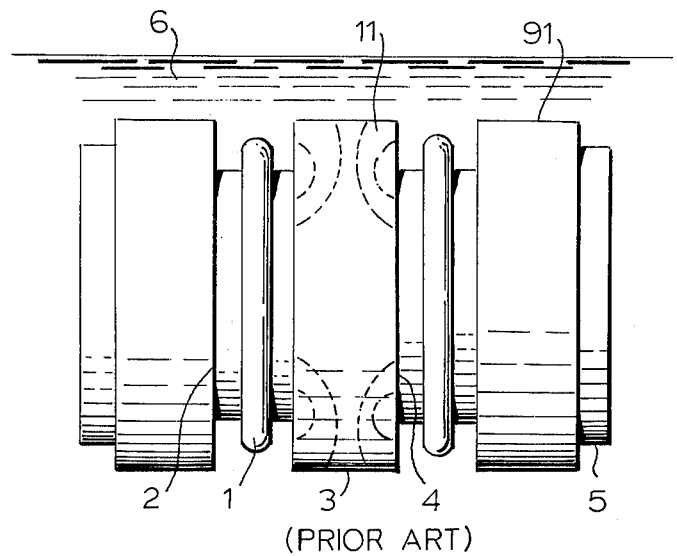
FIG. 1 is a side elevational view, partly in section of one portion of a vapor cooling device constructed in accordance with the principles of the prior art.
Figure 2:
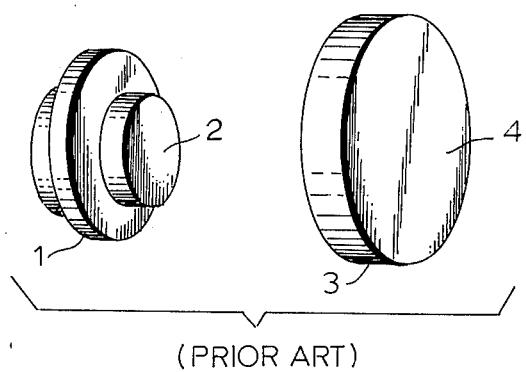
FIG. 2 is an exploded perspective view of the essential portion of the device shown in FIG. 1.

Referring now to the drawings and FIG. 1 in particular, there is illustrated a conventional vapor cooling device. The arrangement illustrated comprises a planar semiconductor element 1 including a combined electrically conductive and thermal transferring flat surface 2 on either side thereof sandwiched between a pair of cooling members 3, each also including a combined electrically conductive and thermal transferring flat surface 4 on either side thereof. One of the cooling members 3, in this example, the righthand one as viewed in FIG. 1, has a similar semiconductor element 1 sandwiched between the same and a similar cooling member 3, and the outermost cooling members 3 abut against the respective electrically insulative plates 5 forming one part of the supporting structures (not shown). In FIG. 2, the planar semiconductor element 1 is shown as being in the form of a flat disc having attached to either side thereof a metallic disc smaller in radius than the element 1 to provide the flat surface 2 and the cooling member 3 is shown as being in the form of a disc including a flat surface 4 on either side thereof. The assembly thus formed is immersed into an amount of refrigerant 6 that is an electrically insulative liquid boilable at a temperature less than the rated temperature of the semiconductor elements 1. The refrigerant 6 may be, for example, FREON (trade mark) R-113. Each of the cooling members 3 includes a thermal transferring surface 91 on the periphery contacted by the refregerant 6 and has heat flowing therethrough due to the heat conduction as shown by paths of heat flow 11 in FIG. 1.

In the arrangement of FIG. 1, an electric current may flow from one semiconductor element 1 into the adjacent cooling member 3 and then to the other semiconductor element 1 depending upon the particular circuit configuration. At that time, heat generated in the semiconductor element 1 due to a resistance loss is transferred to the adjacent cooling member 3 through the thermal transferring surfaces 2 and 4 and then flows along the paths of heat flow 11 within the cooling member 2 until it is transferred to the refrigerant 6 through the thermal transferring surface 91.

Figure 3:
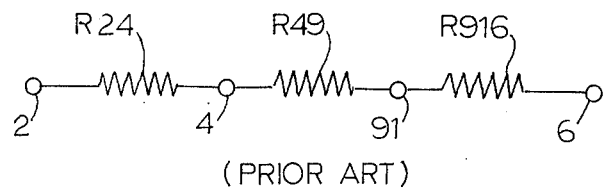
FIG. 3 is a diagram of a thermal resistance circuit equivalent to the arrangement shown in FIG. 1.

While the heat generated in each of the planar semiconductor elements 1 is transferred to the refrigerant 6 through the thermal transferring surface 91 of the cooling member 3 as above described, a temperature difference occurs along the resulting path of heat flow caused from thermal resistances distributed between the thermal transferring semiconductor surface 2 and the refrigerant 6. As shown in FIG. 3 the thermal resistances are equal to the sum of a thermal contact resistance R24 developed between the thermal transferring surfaces 2 and 4 respectively of the semiconductor element 1 and the cooling member 3; a thermal resistance R49 developed between the thermal transferring surfaces 4 and 91 of the cooling member 3 caused from the internal conduction of heat; and a thermal resistance R916 developed due to the heat transfer between the thermal transferring surface 91 and the refrigerant 6.

When attempting to make semiconductor devices small-sized, a corresponding decrease in the dimensions of cooling members may incur the thermal destruction of the devices due to an abrupt increase in temperature. This is because the cooling member becomes extremely high in a thermal flux flowing through the thermal transferring surface contacted by the refrigerant. This increase in influx is enough to change the boiling of the refrigerant from the region of nuclear ebullition (in which bubbles in the form of strings of beads are successively generated from the thermal transferring surface) to the region of film ebullition (in which the refrigerant evaporates while a film of vapor from the refrigerant covers the entire thermal transferring surface and bubbles of the refrigerant are intermittently generated from the film of vapor). Thus the device may abruptly increase in temperature.

In order to make the cooling member 3 small-sized therefore, it can be considered that a good quality of a metallic material high in thermal conductivity will be used to form the cooling member having a heat radiation surface large in area and complicated in surface configuration as well as requiring a combined electrically conductive and thermal transferring surface skillfully finished to be extremely low in contact resistance between the same and the adjacent surface of the planar semiconductor element. Such cooling members will require much labor and become very expensive.

The present invention contemplates to provide a cooling member simple in configuration and simply manufactured to permit the resulting device to be low in thermal resistance and also to be small-sized.

Figure 4:
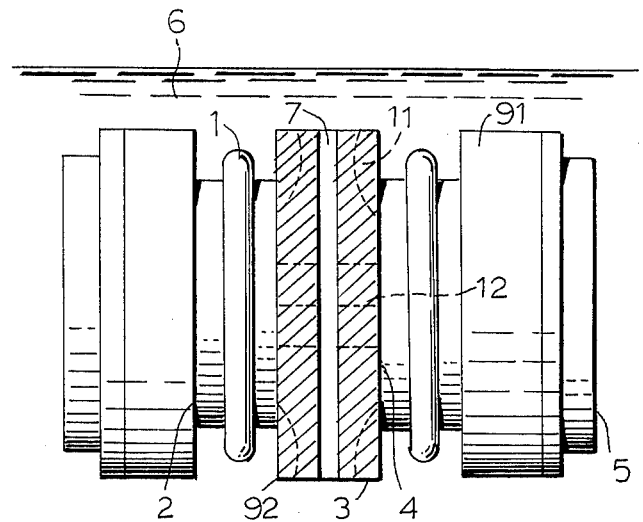
FIG. 4 is a side elevational view of one portion of a vapor cooling device constructed in accordance with the principles of the present invention with the essential portion illustrated in section.
Figure 5A:
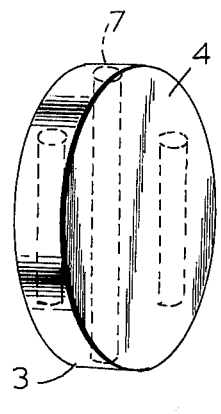
FIGS. 5a and 5b are perspective views of the cooling members shown in FIG. 4.
Figure 5B:
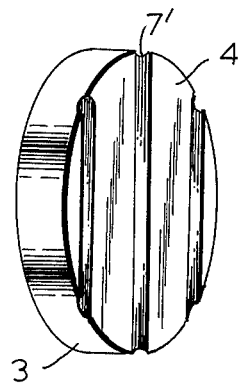

Referring now to FIGS. 4, 5a and 5b wherein like reference numberals designate components identical or similar to those shown in FIG. 1, it is seen that an arrangement disclosed herein is different from that shown in FIGS. 1 and 2 only in the construction of the cooling members'. More specifically, the intermediate cooling member 3 has at least one hole 7 extending therethrough and each of the outermost cooling members has at least one groove 7' running throughout the surface thereof abutting against the insulating plate 5. In FIG. 5a the intermediate cooling member 3 is shown as including the central hole 7 extending through one diameter thereof and a pair of bilateral holes 7 spaced equidistantly from the central hole 7 and parallel thereto, while the outermost cooling member 3 is shown as including the central groove 7' running along one diameter thereof and a pair of bilateral groove 7' spaced equidistantly from the central groove 7' and parallel thereto. In their assembled positions the cooling members 3 are so arranged that the holes 7 and the grooves 7' are vertically directed and aligned with one another. A surface 92 defining each hole 7 provides another thermal transferring surface through which heat from the cooling member 3 is transferred to the refrigerant 6 flowing through the holes 7. The refrigerant also flows through the grooves 7 to remove heat from the outermost cooling members 3.

In the arrangement of FIG. 4, heat generated in each of the planar semiconductor elements 1 due to an electric current flowing therethrough is transmitted through the thermal transferring surface 2 to the cooling member 3 and can then be transferred along a pair of paths of heat flow as shown by the dotted and solid arrows 11 and 12 in the intermediate cooling member 3 and through the respective thermal transferring surfaces 91 and 92 to the refrigerant 6.

Figure 6:
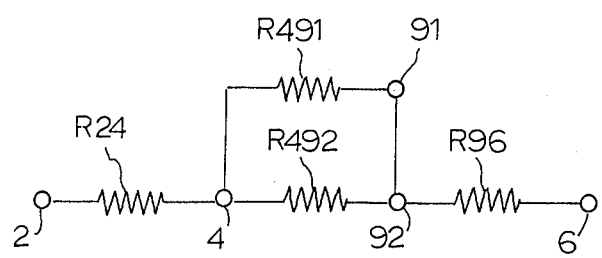
FIG. 6 is a diagram of a thermal resistance circuit equivalent to the arrangement shown in FIG. 4.

Thus the heat generated in each of the semiconductor elements 1 and transferred to the refrigerant flows through a thermal resistance as shown in FIG. 6. In FIG. 6, a thermal resistance R24 developed between the thermal transferring surfaces 2 and 4 respectively of the semiconductor element 1 and the cooling member 3 is thermally connected to a parallel combination of a thermal resistance R491 exhibited by the path of heat flow 11 and a thermal resistance R492 exhibited by the path of heat flow 12. Then this parallel combination of thermal resistances is thermally connected to a thermal resistance R96 developed during the heat transfer from the thermal transferring surfaces 91 and 92 of the cooling member 3 to the refrigerant 6.

By comparing FIG. 6 with FIG. 3, it is seen that the thermal resistance presented to a stream of heat from the thermal transferring surface 4 of the cooling member 3 reaching the refrigerant 6 is of an extremely low magnitude as compared with the corresponding thermal resistance shown in FIG. 3 because the former resistance is the parallel combination of the thermal resistances R492 and R491 with the R492 less than the R491. Further, that surface of the cooling member contacting the refrigerant has an area sufficiently large to minimize the possibility of transiting the boiling of the refrigerant to the region of film ebullition due to an excessive increase in thermal flux. Thus it is possible to make the cooling member 3 small-sized.

Figure 7:
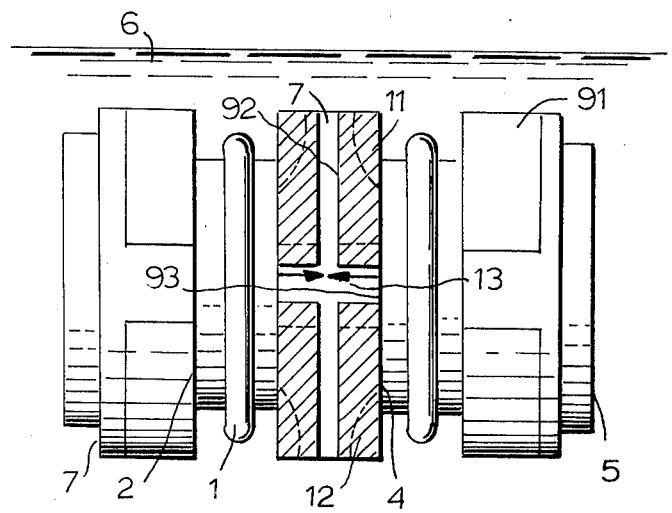
FIG. 7 is a view similar to FIG. 4 but illustrating a modification of the present invention.

While the present invention has been described in terms of the cooling member including the through holes extending in one direction therethrough to permit the refrigerant to communicate with the highest temperature portion thereof the cooling member may have a through hole extending therethrough in another direction, for example, the axial direction thereof as shown in FIGS. 7 and 8 wherein like reference numerals designate the components identical to those shown in FIGS. 4 and 6. The arrangement illustrated is identical to that shown in FIGS. 4 and 5 except in FIGS. 7 and 8 each of the cooling members 3 is provided with an axial hole 8 crossing and communicating with the central hole 7 or the central groove 7' as the case may be.

Figure 9:
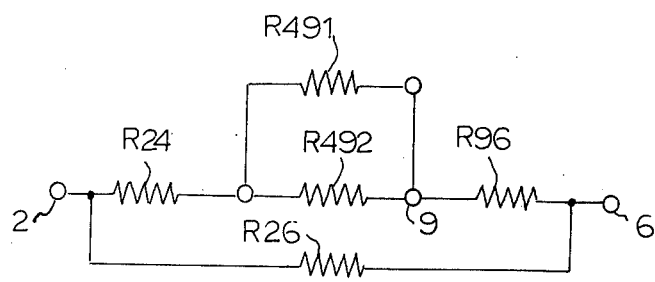
FIG. 9 is a diagram similar to FIG. 6 but illustrating the arrangement shown in FIG. 7.

This measure permits a heat stream from the semiconductor element 1 to flow along a third path of heat flow as designated by the white arrow 13 in FIG. 7, in addition to the two paths of heat flow 11 and 12. The axial hole 8 serves to directly contact the highest temperature portion of the thermal transferring surface 2 of the semiconductor element 1 with the refrigerant passed through the central hole 7 or the central groove 7'. Accordingly, the thermal transferring surface 2 of the planar semiconductor element 1 is additionally connected to the refrigerant 6 through a thermal resistance R26 developed therebetween as shown in FIG. 9 wherein like reference numerals designatethe components identical to those shown in FIG. 6.

Figure 8A:
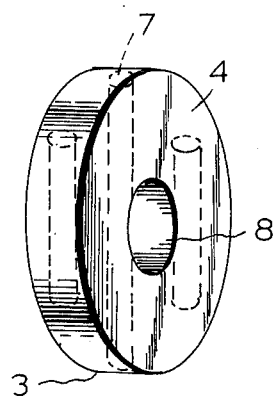
FIGS. 8a and 8b are views similar to FIGS. 5a and 5b respectively but depicting the arrangement shown in FIG. 7.
Figure 8B:
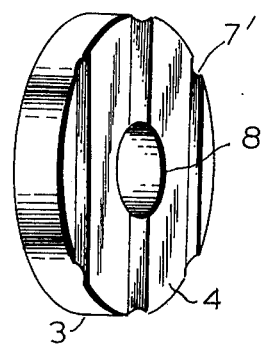

Thus it will be appreciated that the cooling member 3 as shown in FIGS. 7, 8a and 8b includes a thermal flux less than that in the cooling member as shown in FIGS. 4, 5a and 5b resulting in an increase in the cooling effect in the region of nuclear ebullition.

Figure 10:
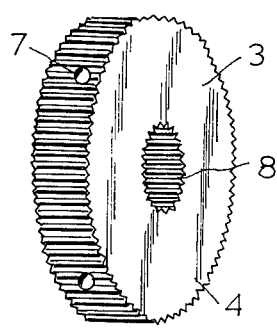
FIG. 10 is a perspective view of another cooling member constructed in accordance with the principles of the present invention.

An arrangement as shown in FIG. 10 is different from that illustrated in FIG. 8a only in that in FIG. 10 the intermediate cooling member 3 includes the outer peripheral surface knurled into sawteeth and the axial hole 8 having the inner wall surface also knurled into sawteeth.

Figure 11:
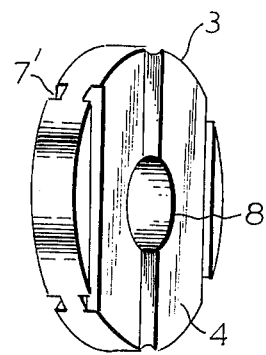
FIG. 11 is a view similar to FIG. 10 but illustrating still another cooling member.

The outermost cooling member 3 as shown in FIG. 11 is identical to that illustrated in FIG. 8b except the in FIG. 11 that surface thereof abutting against the insulating plate (not shown in FIG. 11) is provided with grooves 7' aligned with those on the other surface thereof.

Figure 12:
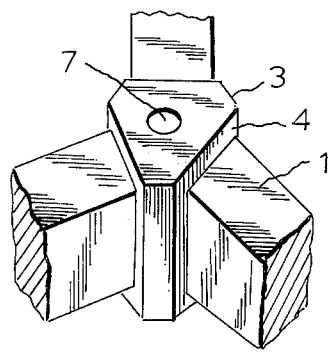
FIG. 12 is a fragmental perspective view of another cooling device embodying the principles of the present invention.

FIG. 12 shows a modification of the present invention in which a single cooling member is used to cool three heat generation members. As shown in FIG. 12, a cooling member 3 is of a generally equilateral triangular prism having an axial hole 7 extending therethrough and has three similar heat generation members 1 abutting against the flat surfaces thereof.

From the foregoing it will be appreciated that the present invention has provided a cooling memberhaving a thermal flux sufficiently low to minimize the possibility of changing the boiling of the particular refrigerant to the region of film ebullition, thereby allowing the cooling member to be small-sized.

While the present invention has been illustrated and described in conjunction with a few preferred embodiments thereof it is to be understood that numerous changes and modifications may be resorted to without departing from the spirit and scope of the present invention. For example, the present invention is equally applicable to a variety of heat generation members operatively connected to the cooling member and cooled according to the vapor cooling system. The cooling member may include a thermal transferring surface having any desired profile other than the circular profile. Further any desired number of heat generation members may be effectively cooled by the cooling members as above described by alternating them.

What we claim is:

1. A cooling device comprising:
   a plurality of planar semiconductor elements having a pair of flat surfaces on opposite sides thereof;
   a plurality of planar cooling members having a pair of flat surfaces on opposite sides therof, each planar cooling member positioned between and abutting the flat surfaces of a pair of said semiconductor elements, and each planar cooling member having a plurality of parallel, vertical first passageways therein between the circumference thereof and at least one second passageway therethrough between said two opposite flat surfaces transverse to and through at least one of said first passageways and opening against the surface of at least one of said semiconductors abutting said cooling member; and
   an electrically insulative refrigerant liquid completely surrounding said semiconductor elements and said cooling members and filling said first and second passageways in said cooling member, said refrigerant liquid having a boiling point less than the rated temperature of said semiconductor element.

2. A cooling device as claimed in claim 1 wherein said first passageways are vertical, parallel holes passing through the perimeter of and completely through said cooling member.

3. A cooling device as claimed in claim 1 wherein said first passageways are a plurality of vertical, parallel grooves running completely across at least one of said flat surfaces of said cooling member.

4. A cooling device as claimed in claim 1 wherein said first passageways are a plurality of parallel, vertical grooves running completely across both flat surfaces of said cooling member.

* * * * *